United States Patent
Kato

(10) Patent No.: US 6,784,762 B2
(45) Date of Patent: Aug. 31, 2004

(54) LAMINATED LC FILTER WHERE THE PATTERN WIDTHS OF THE CENTRAL PORTION AIR IS GREATER THAN THE END PORTIONS

(75) Inventor: Noboru Kato, Sabae (JP)

(73) Assignee: Murata Manufacturing Co., Ltd., Kyoto (JP)

(*) Notice: Subject to any disclaimer, the term of this patent is extended or adjusted under 35 U.S.C. 154(b) by 56 days.

(21) Appl. No.: 10/186,609

(22) Filed: Jul. 2, 2002

(65) Prior Publication Data

US 2003/0016098 A1 Jan. 23, 2003

Related U.S. Application Data

(62) Division of application No. 09/566,323, filed on May 8, 2000, now Pat. No. 6,437,665.

(30) Foreign Application Priority Data

May 7, 1999 (JP) .......................................... 11-127818

(51) Int. Cl.[7] ................................................. H03H 7/01
(52) U.S. Cl. ....................................... 333/185; 333/204
(58) Field of Search .............................. 333/184, 185, 333/177, 204

(56) References Cited

U.S. PATENT DOCUMENTS

5,892,415 A * 4/1999 Okamura ................. 333/185 X
6,191,667 B1 * 2/2001 Takenaka et al. ........... 333/185
6,294,967 B1 * 9/2001 Hirai et al. ............. 333/204 X

FOREIGN PATENT DOCUMENTS

JP  11-041004  2/1999
JP  11-055003  2/1999

* cited by examiner

*Primary Examiner*—Benny Lee
(74) *Attorney, Agent, or Firm*—Keating & Bennett, LLP

(57) ABSTRACT

A laminated LC filter having very large inductance and an excellent Q characteristic, includes insulation layers, inductor patterns having substantially the same shapes and capacitor patterns. The inductor patterns are laminated through the insulation layers, and constitute the inductor of the duplex structure. Similarly, the inductor patterns also constitute the inductor of the duplex structure. The capacitor patterns are opposite to the increased width portions of the inductor patterns, and define the capacitor. Similarly, the capacitor patterns are opposite to the increased width portions of the inductor patterns, and define the capacitor. The coupling capacitor pattern is located between the inductor patterns.

6 Claims, 10 Drawing Sheets

LAMINATED LC FILTER WHERE THE PATTERN WIDTHS OF THE CENTRAL PORTION AIR IS GREATER THAN THE END PORTIONS

This application is a Divisional of U.S. patent application Ser. No. 09/566,323 filed May 8, 2000, now U.S. Pat. No. 6,437,665.

BACKGROUND OF THE INVENTION

1. Field of the Invention

The present invention relates to an LC filter, and more particularly, to a laminated LC filter for use with high frequencies.

2. Description of the Related Art

In general, a band pass filter that allows a signal of a specific frequency band to pass through includes a plurality of LC resonators. A configuration of one example of a conventional band pass filter is shown in FIG. 13. As shown in FIG. 13, the band pass filter 1 includes the first and second stage LC resonators Q1 and Q2 within a laminate body constructed of layered ceramic sheets 3.

The inductances of the LC resonators Q1 and Q2 are generated by the inductor patterns 4a, 4b, 5a, and 5b. The capacitances of the LC resonators Q1 and Q2 are generated by the capacitor patterns 6a to 6c, 7a to 7c, and the inductor patterns 4a, 4b, 5a, and 5b are arranged on the surface of the ceramic sheets 3 such that the inductor patterns 4a, 4b, 5a, and 5b do not contact the capacitor patterns 6a to 6c, 7a to 7c. The above-described LC resonators Q1 and Q2 are electro-magnetically coupled together.

A leading edge of the inductor pattern 4a is connected to an input lead pattern 14 that is provided on a left side of the sheet 3. A leading edge of the inductor pattern 5a is connected to an output lead pattern 15 that is provided on a right side of the sheet 3. The inductor patterns 4a, 4b, 5a, and 5b and the capacitor patterns 6a to 6c and 7a to 7c are arranged in a layered configuration with alternating layers. The shielding patterns 12a and 12b are provided on either side of this layered configuration.

FIGS. 14 and 15 illustrate another example of a conventional laminated band pass filter. This band pass filter 21 includes first and second stage LC resonators Q1 and Q2 within a laminate body 41 constructed of layered ceramic sheets 23.

The inductances of the LC resonators Q1 and Q2 are generated by the inductor patterns 24 and 25. The capacitances of the LC resonators Q1, Q2 are generated by the capacitor patterns 26 and 27, and the leading edges 24a and 25a of the inductor patterns 24 and 25 are arranged on the surface of the ceramic sheets 23 such that the inductor patterns 24 and 25 do not contact the capacitor patterns 26 and 27. The above-described LC resonators Q1 and Q2 are electrically coupled by a coupling capacitor that is provided by these inductor patterns 24 and 25 and the coupling capacitor pattern 28 that is located opposite to these inductor patterns 24 and 25. These LC resonators Q1 and Q2 are capacitive-coupled to an input lead pattern 29 and an output lead pattern 30, respectively. The shielding patterns 32a and 32b are provided on either side of the layered patterns 24 to 30.

In the laminated body 41, an input terminal electrode 42, an output terminal electrode 43 and shielding terminal electrodes 44 and 45 are provided as shown in FIG. 15. An input lead pattern 29 is connected to the input terminal electrode 42, and an output lead pattern 30 is connected to the output terminal electrode 43. The lead portions of the inductor patterns 24 and 25 and the end portions of the shielding pattern 32a and 32b are connected to the shielding terminal electrode 44. The lead portions of the capacitor patterns 26 and 27 and the other end portions of the shielding pattern 32a and 32b are connected to the shielding terminal electrode 45.

The band pass filter 1 as shown in FIG. 13 is laminated such that the inductor patterns 4a to 5b are sandwiched by the capacitor patterns 6a to 6c, 7a to 7c, so that electric currents flow into each of the inductor patterns 4a, 4b, 5a, and 5b from two capacitor patterns arranged on both sides. Accordingly, the amount of electric current (a current density) flowing through the inductor patterns 4a to 5b increases. As a result, relatively poor Q characteristics of the LC resonators Q1 are Q2 are produced.

Further, in the band pass filter 21 as shown in FIGS. 14 and 15, the magnetic field H generated in the vicinity of the inductor patterns 24 and 25 does not effectively utilize the area S enclosed by a dotted line in FIG. 16 as a magnetic path. As a result, the inductances of the LC resonators Q1 and Q2 are small. Additionally, because the magnetic field H is concentrated at the edges of the inductor patterns 24 and 25, substantial eddy current loss arises, and thus, poor Q characteristics are produced.

Moreover, as shown in FIG. 17, the magnetic field H generated in the vicinity of the inductor patterns 24 and 25 is blocked by the coupling capacitor pattern 28 and the input/output lead patterns 29, 30. Accordingly, the inductances of the LC resonators Q1, Q2 are also reduced.

SUMMARY OF THE INVENTION

In order to overcome the problems described above, preferred embodiments of the present invention provide a laminated LC filter having a greatly increased inductance and an excellent Q characteristic.

According to one preferred embodiment of the present invention, a laminated LC filter includes a laminated body including a plurality of insulation layers stacked on each other, a plurality of inductor patterns, and a plurality of capacitor patterns. The laminated LC filter further includes a plurality of LC resonators having a plurality of inductors constructed of inductor patterns, and a plurality of capacitors in which capacitor patterns are arranged such that the capacitor patterns do not contact the inductor patterns, at an inside of the laminated body. The inductor of each LC resonator has a multiplex structure defined by laminating two or more of the inductor patterns having approximately the same shapes via the insulation layers, and coupling capacitor patterns for capacitive-coupling between the LC resonators are laminated between the inductor patterns of the inductors.

In one preferred embodiment of the present invention, capacitor patterns for an input/output are laminated between the inductor patterns of the inductors.

Preferably, three or more stages of filters are provided by connecting at least three of the LC resonators. The pattern widths of the inductor patterns defining the LC resonators at locations other than both ends thereof are wider than the pattern widths of the inductor patterns defining the LC resonators at both end locations. Further, the pattern widths of the inductor patterns defining the LC resonators are reduced at the ends thereof.

A preferred embodiment of the present invention further includes patterns for pole adjustment which are laminated between the inductor patterns of the inductors.

With the above-described configuration, no magnetic field is generated between two or more of the inductor patterns having approximately identical shapes which constitute the respective inductors. Further coupling capacitor patterns and/or capacitor patterns for an input/output that are arranged between the inductor patterns do not block the magnetic field of the inductors.

Moreover, by constructing the inductor to have a multiplex structure, the magnetic field generated in the vicinity of the inductor is alleviated from being concentrated at the edge of the inductor patterns. Further, the inductor patterns in the respective LC resonators correspond to the capacitor patterns at least one-to-one. As a result, the amount of electric current flowing into the respective inductor patterns from the capacitor patterns is much less than in the conventional LC filter. Accordingly, the current density flowing through the inductor patterns is reduced, and the Q characteristic of the respective LC resonators is greatly improved.

Further, the laminated LC filter according to a preferred embodiment of the present invention includes three or more stages of filters which are constructed by connecting at least three of the LC resonators, and the pattern widths of the inductor patterns defining the LC resonators at locations other than both ends thereof are wider than the pattern widths of the inductor patterns defining the LC resonators at both end locations. Further, the pattern widths of the inductor patterns defining the LC resonators are reduced at the ends thereof. Usually, for the inductor patterns that constitute the LC resonator, the magnetic field concentration at the edges of the inductor patterns in the vicinity of the ends thereof is less than the magnetic field concentration at the edges of the inductor patterns in the remainder of the inductor pattern. Further, The magnetic field concentration at the edges of the inductor patterns defining the LC resonators at locations other than both ends thereof is larger than the magnetic field concentration at the edges of the inductor patterns defining the LC resonators at both end locations. By configuring the patterns widths of the inductor patterns of the LC resonators at locations other than both ends to be wider, the magnetic field concentration at the edges of the inductor patterns of the LC resonators at locations other than both ends thereof is reduced.

Therefore, by reducing the width of the inductor pattern at the ends thereof, the magnetic field at the edges of the inductor patterns is reduced.

Moreover, by laminating the patterns for a pole adjustment between the inductor patterns of the inductors, the pole position of the filter is set easily, without blocking the magnetic field generated in the vicinity of the inductors.

Other features, elements, characteristics and advantages of the present invention will become apparent from the detailed description of preferred embodiments thereof with reference to the drawings attached hereto.

DETAILED DESCRIPTION OF PREFERRED EMBODIMENTS

In the following, preferred embodiments of the laminated LC filter according to the present invention will be described with reference to the accompanying drawings. Each preferred embodiment is described below with reference to a band pass filter as an example of a suitable LC filter. However, preferred embodiments of the present invention may also be band eliminating filters and other suitable filters.

Figure 1:
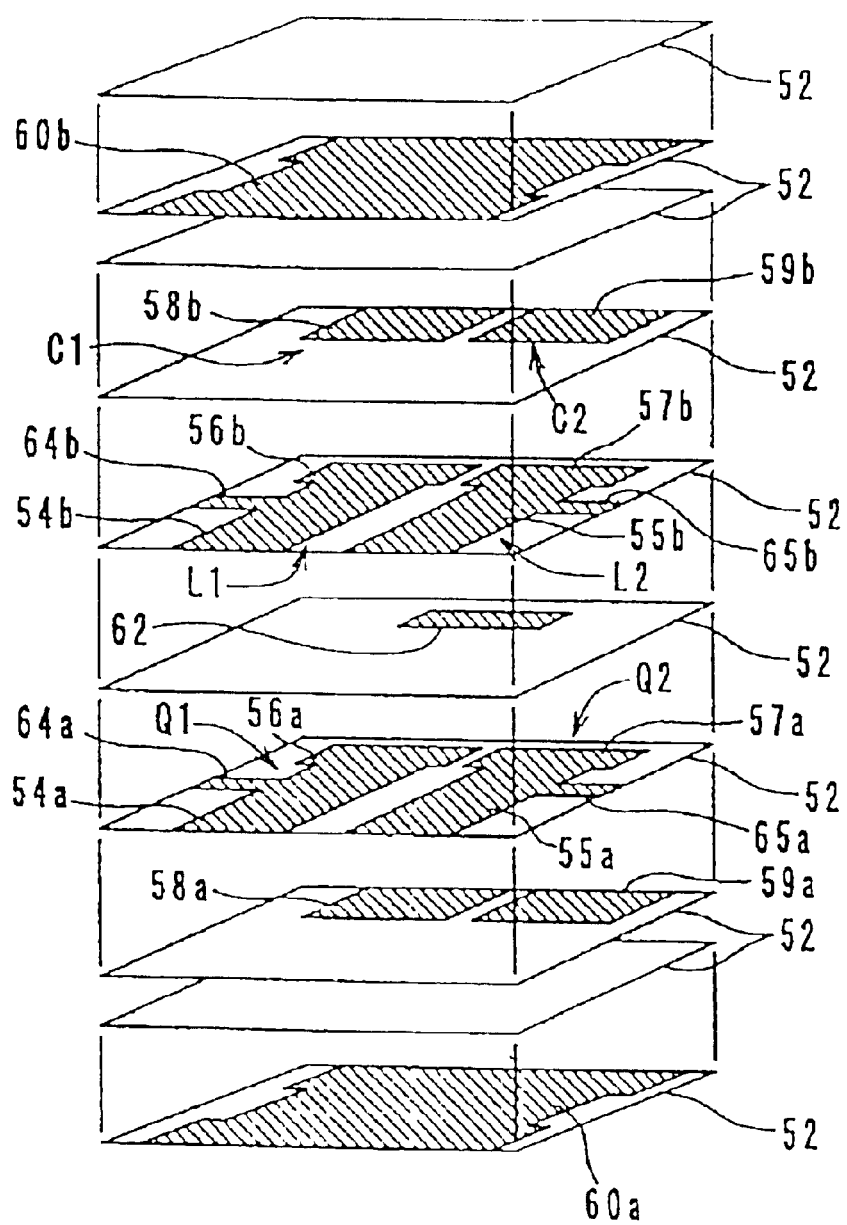
FIG. 1 is an exploded perspective view of a laminated LC filter according to a first preferred embodiment of the present invention.
Figure 2:
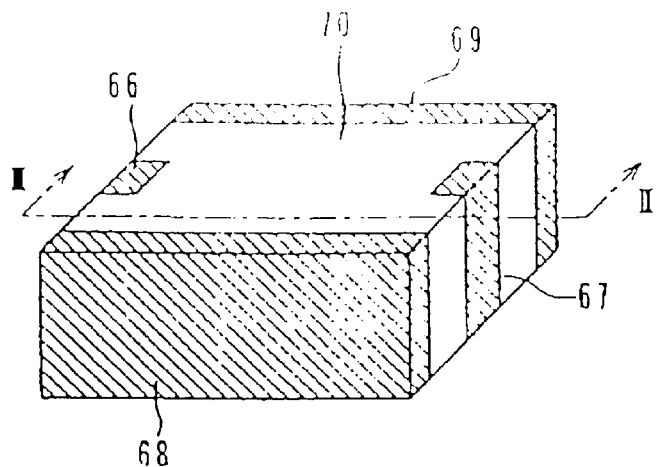
FIG. 2 is a perspective view of the laminated LC filter shown in FIG. 1.
Figure 4:
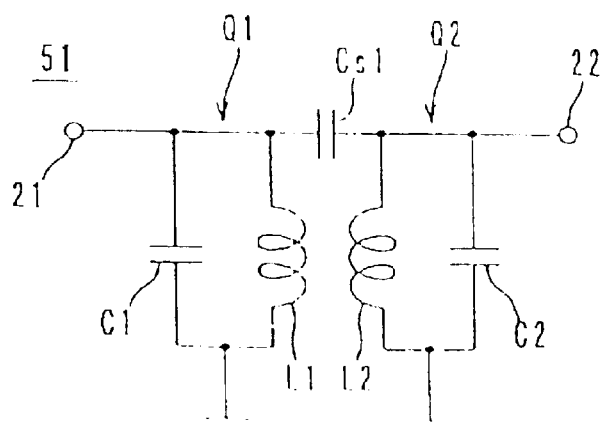
FIG. 4 is an electrical equivalent circuit diagram of the laminated LC filter shown in FIG. 2.

According to a first preferred embodiment of the present invention, a laminated LC band pass filter 51 is shown in FIG. 1, and an appearance perspective view and an electrical equivalent circuit diagram of the LC filter 51 are shown in FIGS. 2 and 4, respectively. As shown in FIG. 4, the LC filter 51 is preferably a double-stage LC band pass filter, and the LC resonator Q1 at the first stage and the LC resonator Q2 at the second stage are capacitive-coupled by the coupling capacitor Cs1.

As shown in FIG. 1, the LC filter 51 includes a ceramic sheet 52 in which the inductor patterns 54a, 54b, 55a, and 55b are provided respectively on the surface thereof, a ceramic sheet 52 in which the capacitor patterns 58a, 58b, 59a, and 59b are provided respectively on the surface thereof, a ceramic sheet 52 in which the shielding patterns 60a and 60b are provided on the surface thereof, and a ceramic sheet 52 in which the coupling capacitor pattern 62 is provided on the surface thereof. The ceramic sheets 52 are preferably substantially square-shaped sheets made of a ceramic dielectric material such as a barium titanate, or other suitable material.

The inductor patterns 54a and 54b preferably have a similar shape, and are laminated via the sheets 52, and include an inductor L1 having a duplex structure. The inductor patterns 54a and 54b located at left-side locations of the sheet 52 are such that ends thereof are exposed at a front edge of the sheet 52. The other ends 56a and 56b of the inductor patterns 54a and 54b define increased width portions, and these increased width portions 56a and 56b also define the capacitor patterns. The input lead patterns 64a and 64b that extend from the approximately central portions of the inductor patterns 54a and 54b are exposed on a left edge of the sheet 52.

The inductor patterns 55a and 55b are similarly shaped, and are laminated through the sheets 52. These inductor patterns 55a and 55b constitute an inductor L2 having a duplex structure. The inductor patterns 55a and 55b provided at the right-side portions of the sheet 52 are such that ends thereof are exposed at a front edge portion of the sheet 52. The other ends 57a and 57b of the inductor patterns 55a and 55b define increased width portions, and these increased width portions 57a and 57b also define the capacitor patterns. The output lead patterns 65a and 65b which extend from the approximately central portions of the inductor patterns 55a and 55b are exposed on a right edge of the sheet 52.

The capacitor patterns 58a and 58b are provided at the left-side portions of the sheet 52, and ends thereof are exposed at a rear edge of the sheet 52. In the stacking direction of the sheets 52, the inductor L1 having the duplex structure is arranged between the capacitor patterns 58a and 58b. These capacitor patterns 58a and 58b are arranged so as not to contact the increased width portions 56a, 56b of the inductor patterns 54a, 54b, and define the capacitor C1. An LC parallel resonance circuit is defined by the capacitor C1 and the inductor L1 of the duplex structure, and constitutes the LC resonator Q1 at the first stage.

The capacitor patterns 59a and 59b are provided at the right-side portions of the sheet 52, and one edge thereof is exposed at a rear edge of the sheet 52. In the stacking direction of the sheets 52, the inductor L2 having the duplex structure that includes the inductor patterns 55a, 55b is arranged between the capacitor patterns 59a, 59b. These capacitor patterns 59a, 59b are opposite to the increased width portions 57a, 57b of the inductor patterns 55a, 55b, and define the capacitor C2. Then, an LC parallel resonance circuit is defined by the capacitor C2 and the inductor L2 having the duplex structure, and constitutes the LC resonator Q2 at the second stage.

The coupling capacitor pattern 62 is provided in the approximately central portion at a rear side of the sheet 52, and in the stacking direction of the sheets 52, it is located between the inductor patterns 54a, 55a and the inductor patterns 54b, 55b. This coupling capacitor pattern 62 is opposite to the increased width portions 56a, 56b, 57a, 57b, and defines the coupling capacitor Cs1. The shielding patterns 60a, 60b of the wide areas are such that first ends thereof are exposed on a side at a front side, and the other ends thereof are exposed on a side at a rear side.

Each sheet 52 configured as described above is stacked in sequence as shown in FIG. 1, and is fired so as to provide the laminated body 70 as shown in FIG. 2. The input terminal electrode 66 and the output terminal electrode 67 are disposed at the left and right ends of the laminated body 70, respectively, and the shielding electrodes 68, 69 are disposed at the sides of the front and rear, respectively. The input lead patterns 64a, 64b are connected to the input terminal electrode 66, and the output lead patterns 65a, 65b are connected to the output terminal electrode 67. First ends of the inductor patterns 54a, 54b, 55a, 55b and first ends of the shielding patterns 60a, 60b are connected to the shielding terminal electrode 68. First ends of the capacitor patterns 58a, 58b, 59a, 59b and the other ends of the shielding patterns 60a, 60b are connected to the shielding terminal electrode 69.

Figure 3:
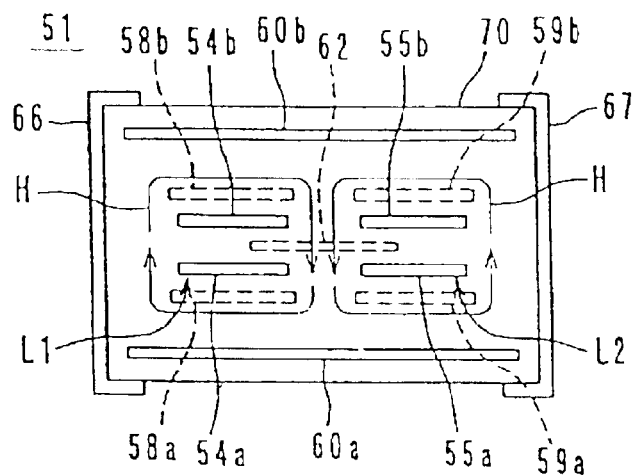
FIG. 3 is a schematic diagram showing a state of a magnetic field as seen from the section along lines III—III in FIG. 2.

In this LC filter 51, as shown in FIG. 3, no magnetic field is generated between the inductor patterns 54a and 54b as well as between the inductor pattern 55a and 55b, that constitute each of the inductors L1, L2. Accordingly, the coupling capacitor pattern 62 that is arranged between the inductor patterns 54a, 55a and 54b, 55b rarely blocks the magnetic field H. As a result, the uniform magnetic field H is generated in the surrounding areas of the inductor patterns 54a, 54b and in the surrounding areas of the inductor patterns 55a, 55b, respectively, thereby achieving a large inductance.

Furthermore, since the inductors L1, L2 have the duplex structures, the distribution of the magnetic field H generated in the respective surroundings of the inductors L1, L2 is made to be excellent by adjusting the space between the inductor patterns 54a and 54b, and the space between the inductor patterns 55a and 55b, thereby reducing the magnetic field H concentrated at the edges of the inductor patterns 54a to 55b. As a result, a significant reduction in the eddy current loss is achieved.

Moreover, since the inductor patterns 54a to 55b in the respective LC resonators Q1, Q2 correspond to the capacitor patterns 58a to 59b, one-to-one, respectively, an amount of electric currents flowing into the inductor patterns 54a to 55b from the capacitor patterns 58a to 59b is much less than the conventional one. Accordingly, the present preferred embodiment of the present invention reduces the current density flowing through the inductor patterns 54a to 55b, thereby obtaining the LC filter 51 having an excellent Q characteristic.

Figure 5:
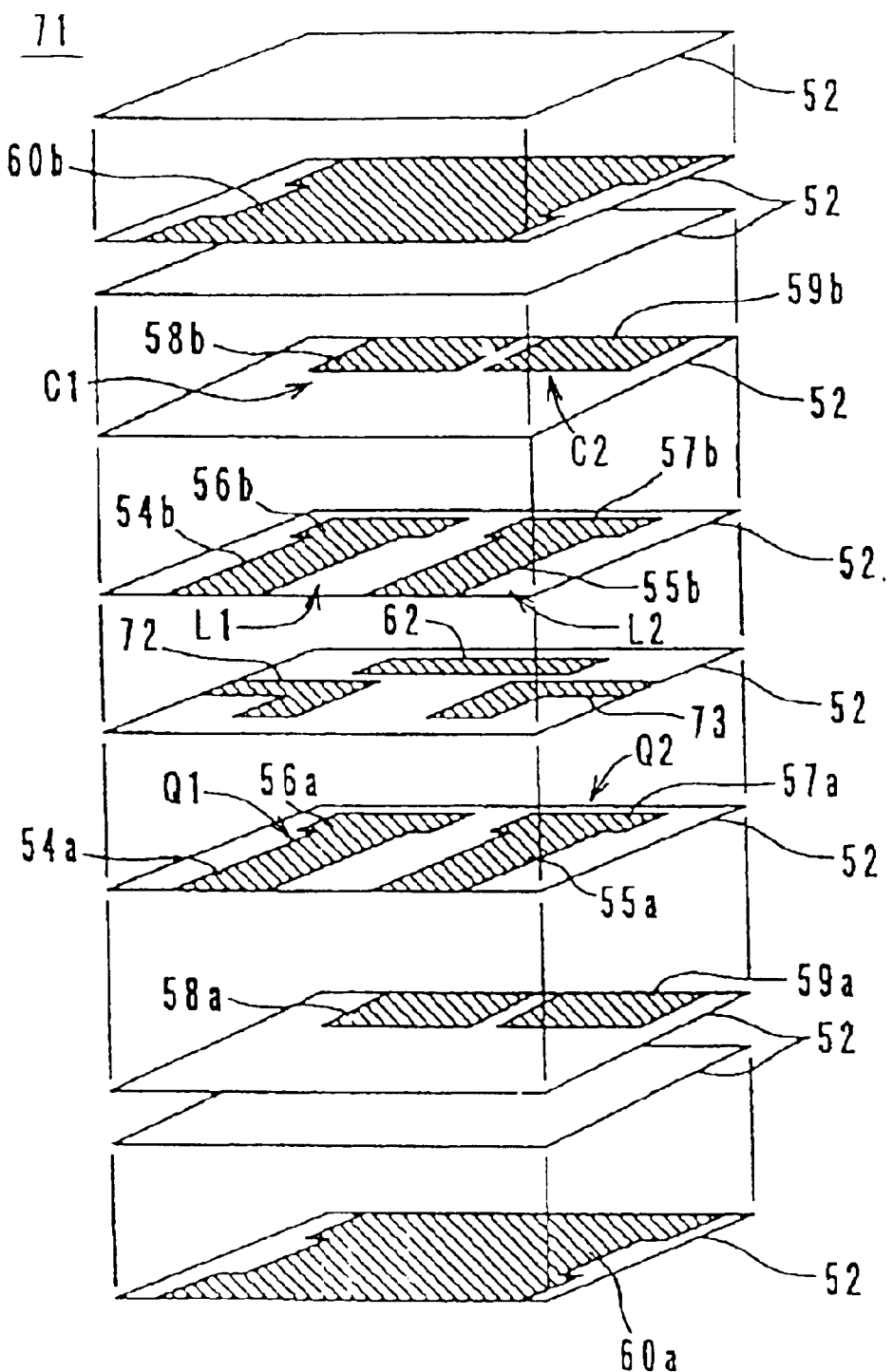
FIG. 5 is an exploded perspective view showing a laminated LC filter according to a second preferred embodiment of the present invention.
Figure 6:
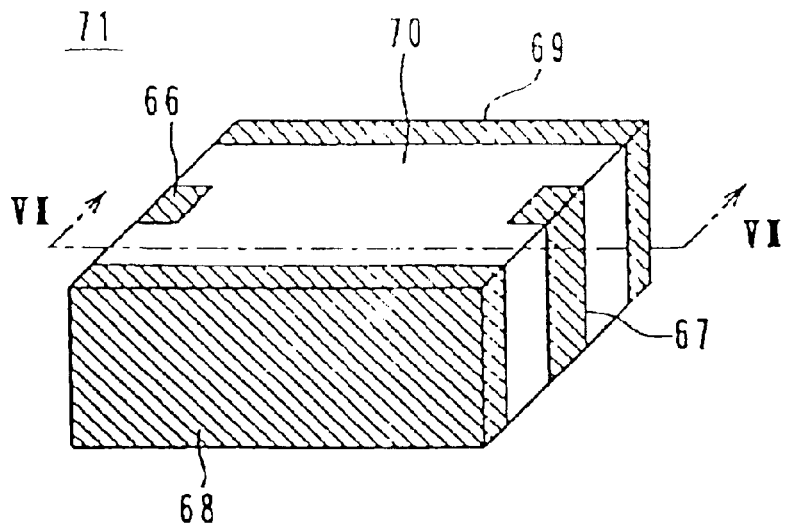
FIG. 6 is an appearance perspective view of the laminated LC filter shown in FIG. 5.

The structure of the second preferred embodiment of the laminated LC filter according to the present invention is shown in FIGS. 5 and 6. The LC filter 71 of the second preferred embodiment is the one in which the capacitor patterns 72, 73 for an input and an output are provided, instead of the input/output lead patterns 64a, 64b, 65a, 65b, in the LC filter 51 of the first preferred embodiment. Further, in FIGS. 5 and 6, the same reference numerals are used to designate similar elements in FIGS. 1 and 2, and the redundant descriptions thereof will be omitted.

The capacitor patterns 72, 73 for an input and output are provided on the ceramic sheet 52 in which the coupling capacitor pattern 62 is provided. The capacitor pattern 72 for the input is opposite to the inductor patterns 54a, 54b via the sheet 52, and is capacitive-coupled to the LC resonator Q1. One end of the capacitor pattern 72 for the input is electrically connected to the input terminal electrode 66 that is exposed at the left side of the sheet 52. The capacitor pattern 73 for the output is opposite to the inductor patterns 55a, 55b via the sheet 52, and is capacitive-coupled to the LC resonator Q2. One end of the capacitor pattern 73 for the output is electrically connected to the output terminal electrode 67 that is exposed at the right side of the sheet 52.

Figure 7:
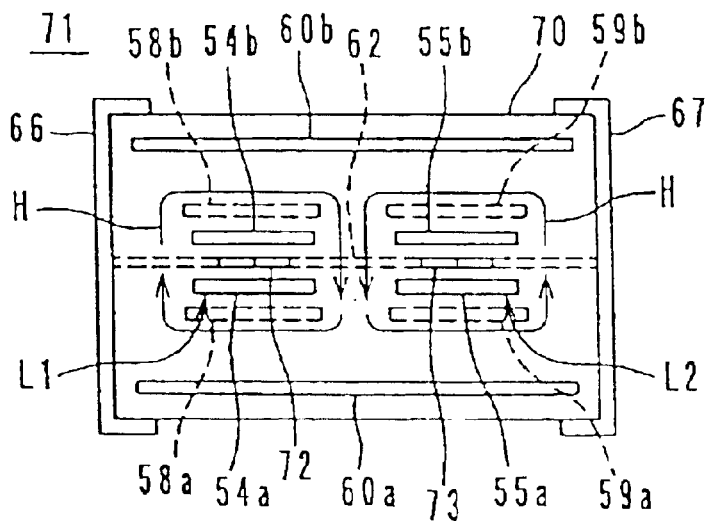
FIG. 7 is a schematic diagram showing a state of a magnetic field as seen from the cross-section along line VII—VII in FIG. 6.

The LC filter 71 configured as described above is, as shown in FIG. 7, the coupling capacitor pattern 62 and the capacitor patterns 72, 73 for the input and output are arranged between the inductor patterns 54a, 55a and 54b, 55b, in the stacking direction of the sheet 52. Accordingly, the coupling capacitor pattern 62 and the capacitor patterns 72, 73 for the input and output rarely block the magnetic field H of the inductors L1, L2. As a result, a uniform magnetic field H is generated, thereby obtaining a large inductance.

Figure 8:
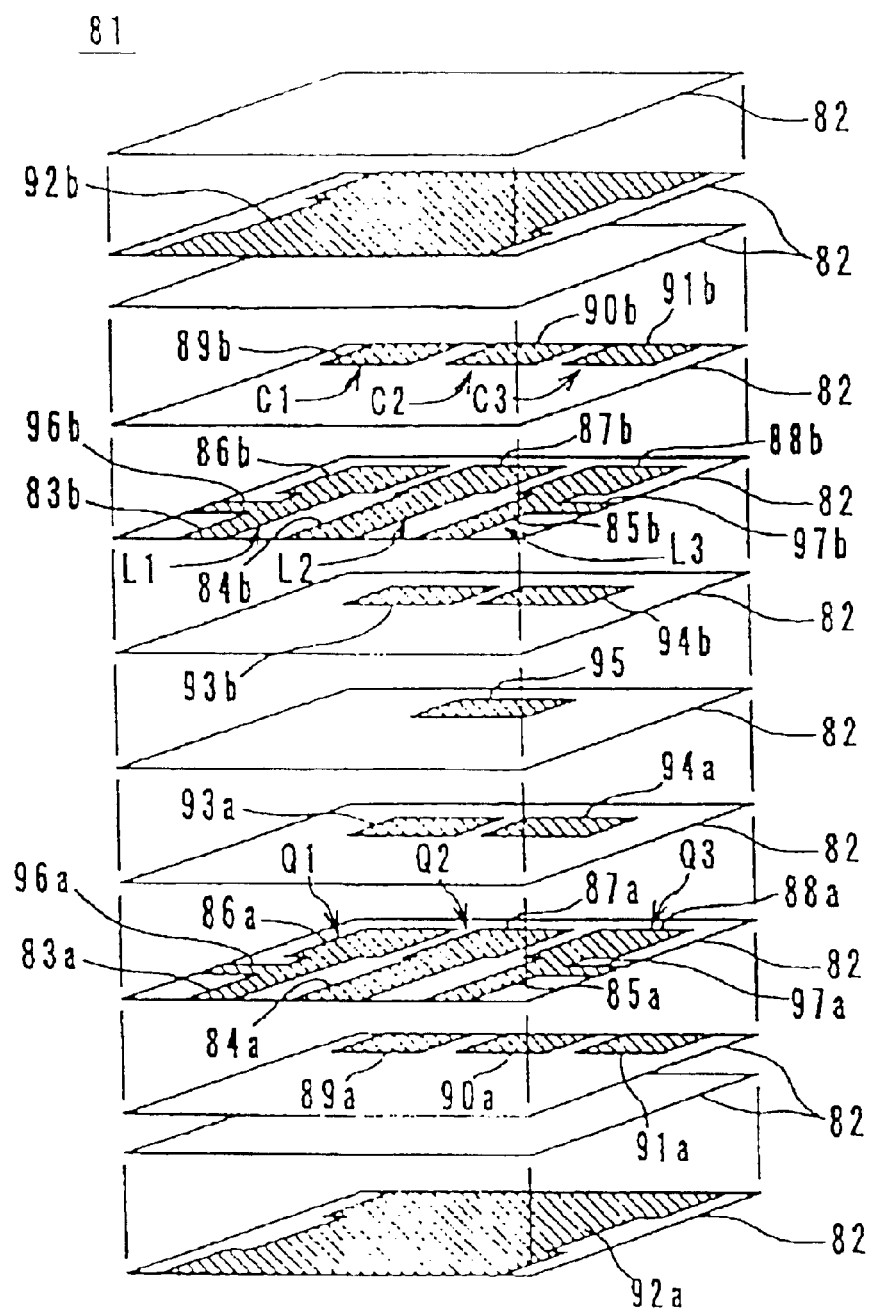
FIG. 8 is an exploded perspective view showing a laminated LC filter according to a third preferred embodiment of the present invention.
Figure 9:
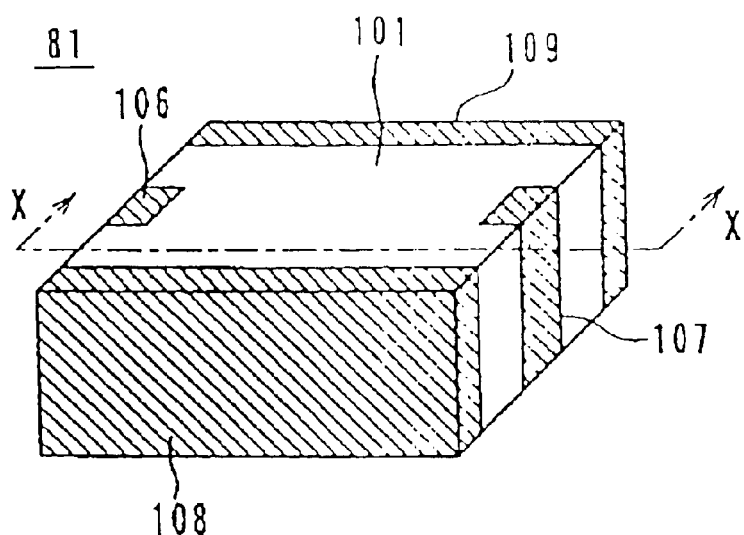
FIG. 9 is an appearance perspective view of the laminated LC filter shown in FIG. 8.
Figure 11:
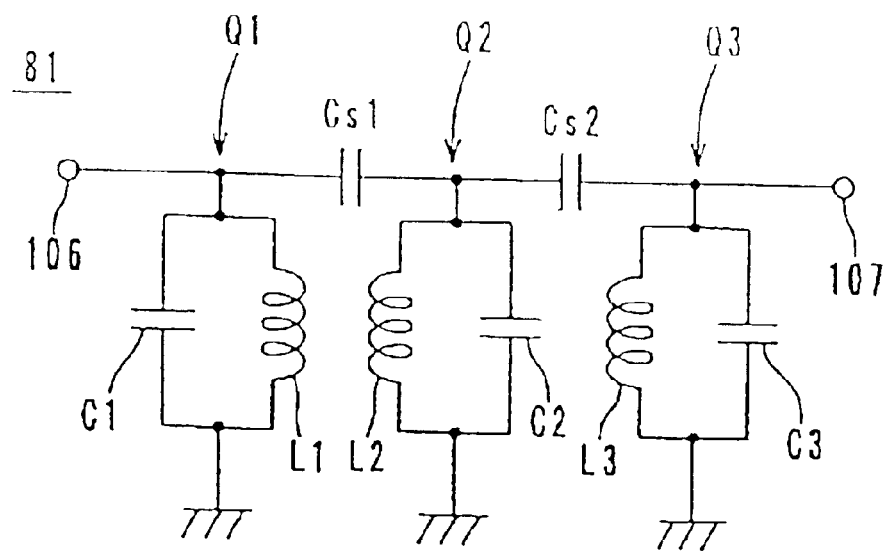
FIG. 11 is an electrical equivalent circuit diagram of the laminated LC filter shown in FIG. 9.

In FIG. 8, a structure of the laminated LC band pass filter 81 is shown, and in FIGS. 9 and 11, an appearance perspective view and an electrical equivalent circuit diagram are shown, respectively. As shown in FIG. 11, the LC filter 81 is a triple-stage LC band pass filter, and the LC resonator Q1 at the first stage (the initial stage), the LC resonator Q2 at the second stage and the LC resonator Q3 at the third stage (the end stage) are cascade-connected (daisy-chained) via the coupling capacitors Cs1, Cs2.

As shown in FIG. 8, the LC filter 81 preferably includes a ceramic sheet 82 of which the inductor patterns 83a, 83b, 84a, 84b, 85a, 85b are provided respectively on the surface, a ceramic sheet 82 of which the capacitor patterns 89a, 89b, 90a, 90b, 91a, 91b are provided respectively on the surface, a ceramic sheet 82 in which the shielding patterns 92a, 92b are provided respectively on the surface, a ceramic sheet 82 in which the coupling capacitor patterns 93a, 93b, 94a, 94b are provided respectively on the surface, and a ceramic sheet 82 to which a pattern 95 for adjusting a pole and similar process.

The inductor patterns 83a, 83b preferably have substantially the same shape, and are laminated through the sheets 82, and constitute an inductor L1 of a duplex structure. The inductor patterns 83a, 83b that are located at the left-side locations of the sheet 82 are such that first ends thereof are exposed on a side at a front side of the sheet 82. The other ends 86a, 86b of the inductor patterns 83a, 83b are increased width portions, and these increased width portions 86a, 86b also function as the capacitor patterns. The input lead patterns 96a, 96b that are extended respectively from the approximately central parts of the inductor patterns 83a, 83b are exposed on a left side of the sheet 82.

The inductor patterns 84a, 84b preferably have the same shape, and are laminated through the sheets 82, and constitute an inductor L2 having a duplex structure. The pattern widths of the inductor patterns 84a, 84b are preferably approximately 10% or more wider, relative to the pattern widths of the inductor patterns 83a, 83b, 85a, 85b. The inductor patterns 84a, 84b that are located at the approximate central locations of the sheet 82 are such that first ends thereof are exposed on a side at a front side of the sheet 82. The other ends 87a, 87b of the inductor patterns 84a, 84b become broad-shoulder, and these increased width portions 87a, 87b also function as the capacitor patterns.

The inductor patterns 85a, 85b have substantially the same shape, and are laminated through the sheets 82, and constitute an inductor L3 having a duplex structure. The inductor patterns 85a, 85b that are located at the right-side locations of the sheet 82 are such that first ends thereof are exposed on a side at a front side of the sheet 82. The other ends 88a, 88b of the inductor patterns 85a, 85b are increased width portions, and these increased width portions 88a, 88b also function as the capacitor patterns. The output lead patterns 97a, 97b that extend respectively from the approximately central parts of the inductor patterns 85a, 85b are exposed on a right side of the sheet 82.

The capacitor patterns 89a, 89b are located at the left-side locations of the sheet 82, and first ends thereof are exposed on a side at a rear side of the sheet 82. In the stacking direction of the sheets 82, an inductor L1 having a duplex structure that is constituted of the inductor patterns 83a, 83b is arranged between the capacitor patterns 89a, 89b. These capacitor patterns 89a, 89b are opposite to the broad-shoulder portions 86a, 86b of the inductor patterns 83a, 83b, and define the capacitor C1. Then, a LC parallel resonance circuit is defined by the capacitor C1 and the inductor L1 having the duplex structure, and constitute the LC resonator Q1 at the first stage.

The capacitor patterns 90a, 90b are arranged in the approximate central locations of the sheet 82, and first ends thereof are exposed on a side at a rear side of the sheet 82. An inductor L2 of a duplex structure that includes the inductor patterns 84a, 84b is arranged between the capacitor patterns 90a and 90b. These capacitor patterns 90a, 90b are opposite to the increased width portions 87a, 87b of the inductor patterns 84a, 84b, and define the capacitor C2. Then, a LC parallel resonance circuit is defined by the capacitor C2 and the inductor L2 having the duplex structure, and constitutes the LC resonator Q2 at the second stage.

The capacitor patterns 91a, 91b are located at the right-side locations of the sheet 82, and first ends thereof are exposed at a rear side of the sheet 82. An inductor L3 having a duplex structure that includes the inductor patterns 85a, 85b is arranged between the capacitor patterns 91a and 91b. These capacitor patterns 91a, 91b are opposite to the increased width portions 88a, 88b of the inductor patterns 85a, 85b, and define the capacitor C3. An LC parallel resonance circuit is defined by the capacitor C3 and the inductor L3 of the duplex structure, and constitutes the LC resonator Q3 at the third stage.

The coupling capacitor patterns 93a, 93b, 94a, 94b are provided at a rear side of the sheet 82, and in the stacking direction of the sheets 82, they are located between the inductor patterns 83a, 84a, 85a and the inductor patterns 83b, 84b, 85b. These coupling capacitor patterns 93a, 93b are opposite to the inductor patterns 83a, 83b, 84a, 84b, and define the coupling capacitor Cs1. The coupling capacitor patterns 94a, 94b are opposite to the inductor patterns 84a, 84b, 85a, 85b, and define the coupling capacitor Cs2.

A pattern 95 for adjusting a pole is arranged between the coupling capacitor patterns 93a, 94a and 93b, 94b. This pattern 95 for adjusting the pole is opposite to the coupling capacitor patterns 93a, 94a, 93b, 94b and defines a capacitance. The shielding patterns 92a, 92b with wide areas are such that first ends thereof are exposed at a front side, and the other ends thereof are exposed at a rear side, respectively.

Each sheet 82 configured as described above is piled up in sequence as shown in FIG. 8, and is laminated body 101 as shown in FIG. 9 by firing integrally. The input terminal electrode 106 and the output terminal electrode 107 are located at the left and right ends of the laminated body 101, respectively, and the shielding electrodes 108, 109 are located at the sides of the front and rear, respectively. The input lead patterns 96a, 96b are connected to the input terminal electrode 106, and the output lead patterns 97a, 97b are connected to the output terminal electrode 107. One ends of the inductor patterns 83a to 85b and first ends of the shielding patterns 92a, 92b are connected to the shielding terminal electrode 108. First ends of the capacitor patterns 89a to 91b and the other ends of the shielding patterns 92a, 92b are connected to the shielding terminal electrode 109.

Figure 10:
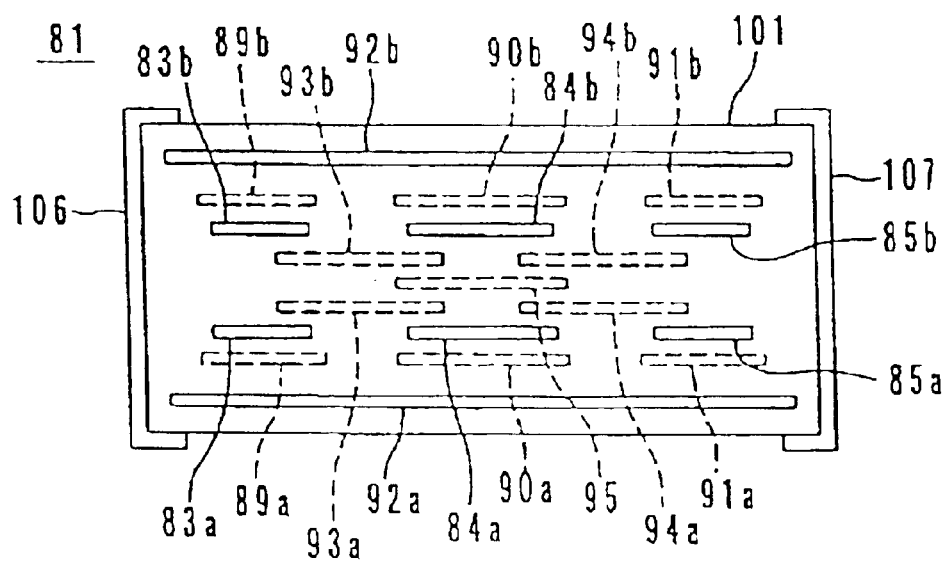
FIG. 10 is a schematic diagram showing a state of a magnetic field as seen in cross-section along line X—X in FIG. 9.

This LC filter 81 achieves results and advantages that is similar to the LC filter 51 in the first preferred embodiment. In this LC filter 81, as shown in FIG. 10, no magnetic field is generated between the inductor patterns 83a and 83b, 84a and 84b, 85a and 85b that constitute each of the inductors L1 to L3. Accordingly, the coupling capacitor patterns 93a to 94b that are arranged between the inductor patterns 83a, 84a, 85a and 83b, 84b 85b and the pattern 95 for adjusting the pole rarely block the magnetic field H of the inductors L1 to L3. As a result, the uniform magnetic field H is achieved, thereby obtaining a very large inductance.

Figure 12:
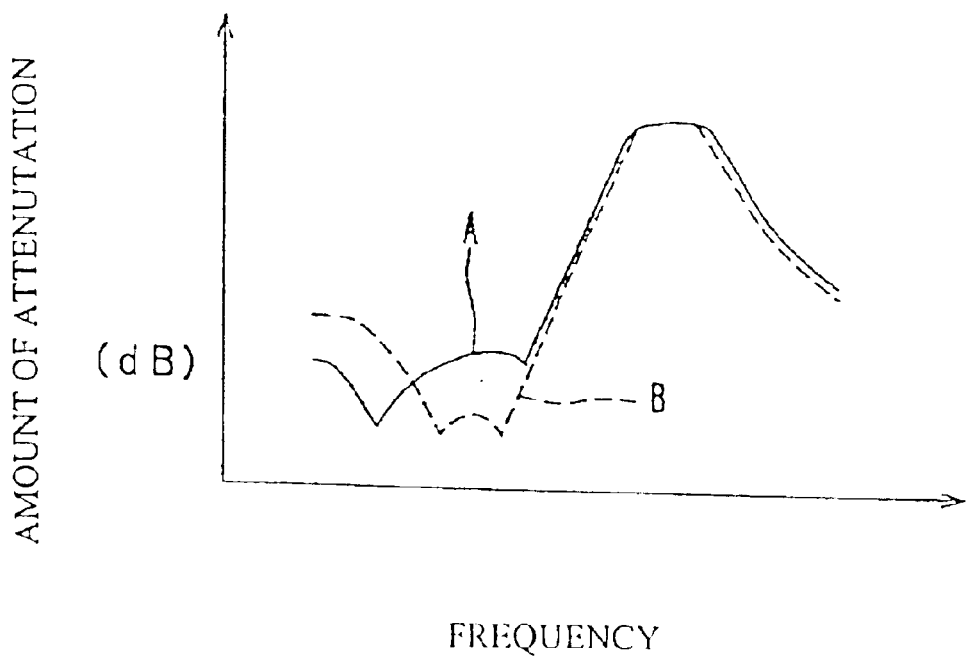
FIG. 12 is a graph showing an attenuation characteristic of the laminated LC filter shown in FIG. 9.

Further, by changing the opposed areas of the pattern 95 for adjusting the pole and the coupling capacitor patterns 93a to 94b, the pole distance of the LC filter 81 can be adjusted. For example, when the opposed areas are large, the capacitance that is generated between the pattern 95 for adjusting the pole and the coupling capacitor patterns 93a to 94b becomes large, and as shown with the solid line A in FIG. 12, it becomes an attenuation characteristic in which the pole distance is great. On the contrary, when the opposed areas are small, as shown with the dotted line B in FIG. 12, it becomes an attenuation characteristic in which the pole distance is small.

Moreover, the inductor patterns 84a, 84b that constitute the LC resonator Q2 at the second stage located at the approximate center of the filter 81 are widened such that the pattern widths thereof are about 10% or wider relative to the inductor patterns 83a, 83b, 85a, 85b that constitute the LC resonators Q1, Q3 at the first and third stages which are located at both ends. Accordingly, the magnetic field H at the edges of the inductor patterns 84a, 84b can be reduced. As a result, it possible to achieve an LC filter 81 with an excellent Q characteristic.

Figure 13:
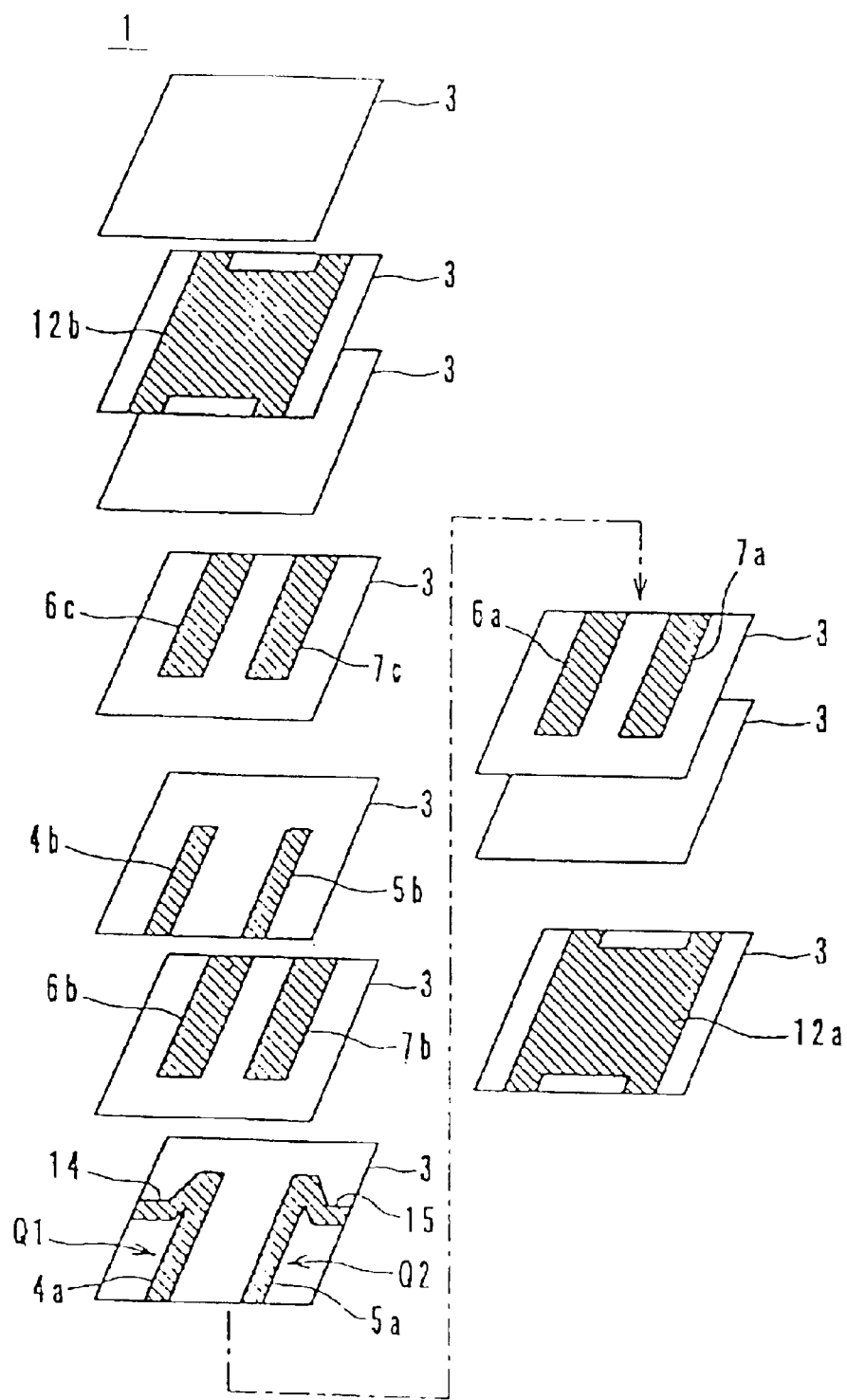
FIG. 13 is an exploded perspective view of a conventional laminated LC filter.
Figure 14:
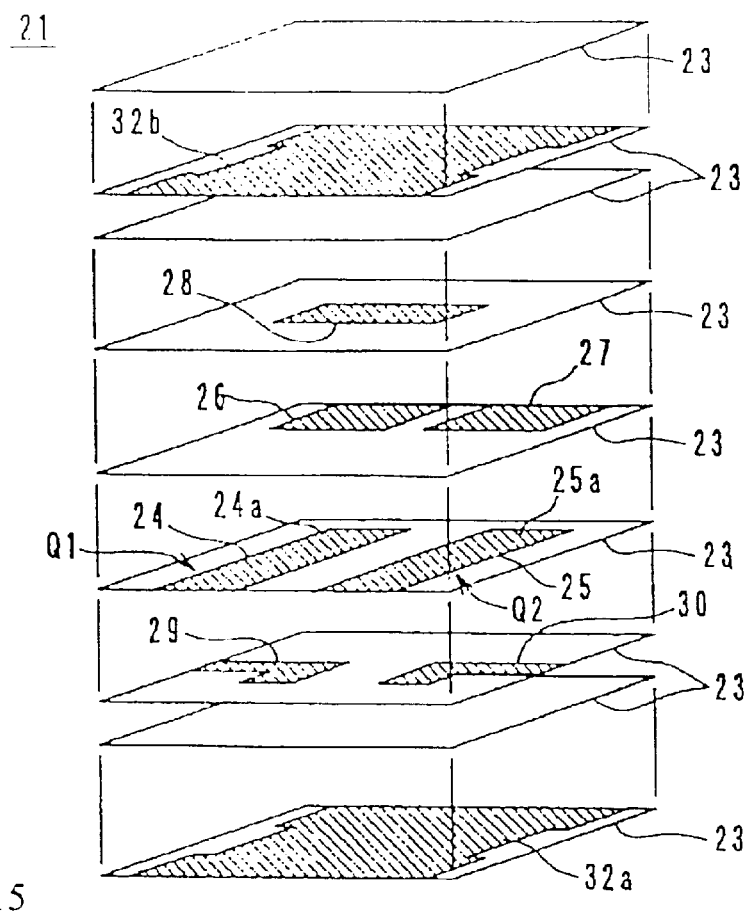
FIG. 14 is an exploded perspective view of another conventional laminated LC filter.
Figure 15:
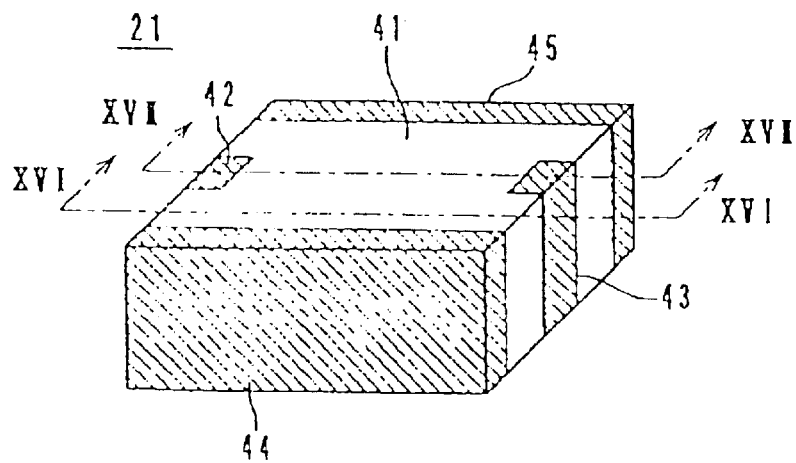
FIG. 15 is an appearance perspective view of the laminated LC filter shown in FIG. 14.
Figure 16:
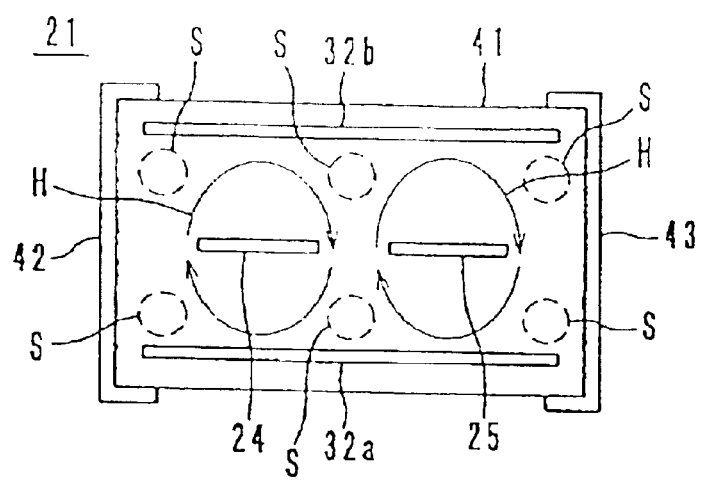
FIG. 16 is a schematic diagram showing a state of a magnetic field as seen in cross-section along line XVI—XVI in FIG. 15.
Figure 17:
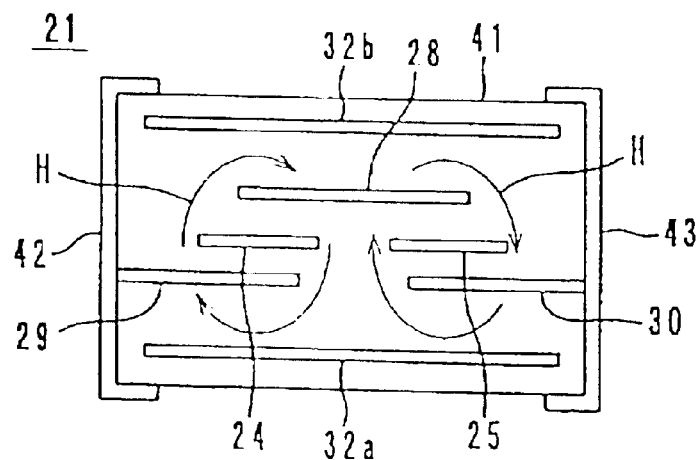
FIG. 17 is a schematic diagram showing a state of a magnetic field as seen in cross-section along line XVII—XVII in FIG. 15.

Incidentally, the laminated LC filter according to the present invention is not limited to the preferred embodiments described above, but may be modified in various forms within the gist thereof. For example, the LC resonators included in the laminated LC filter may be four or more. Further, the first and second preferred embodiments described above are the examples in which the present invention is applied to the conventional laminated LC filter shown in FIG. 13, but it goes without saying that the present invention may be applied to the conventional laminated LC filter shown in FIG. 14.

Further, the preferred embodiments described above are formed by stacking the ceramic sheets on which the patterns are formed, respectively, and then firing the stacked sheets, but the present invention is not limited thereto. The ceramic sheets may be fired in advance. Moreover, the LC filter may be produced by a manufacturing method as described below. After having formed a ceramic layer with a ceramic material in a paste form by a method of printing or other suitable method, an arbitrary pattern is formed by applying a conductive pattern material in a paste form on a surface of the ceramic layer. Then, the ceramic material is applied in the paste form on the conductive pattern so as to make the ceramic layer in which the pattern is provided therein. Similarly, by applying the ceramic material over in sequence, a LC filter with a laminated structure is produced.

As apparent from the above description, according to preferred embodiments of the present invention, since each inductor has a multiplex structure including two or more inductor patterns having approximately the same shape, the magnetic field generated in the surrounding of the inductor and concentrated on the edges of the inductor patterns is minimized. As a result, the inductor patterns in the respective LC resonators correspond to the capacitor patterns at least one-to-one, so that an amount of the electric current flowing into each of the inductor patterns from the capacitor patterns becomes much less than the conventional one. Accordingly, the current density flowing through the inductor patterns is reduced, thereby greatly improving the Q characteristics of the respective LC resonators.

Further, no magnetic field is generated between two or more the inductor patterns having approximately identical shapes that constitute each of the inductors, and the coupling capacitor patterns and the capacitor patterns for an input/output rarely block the magnetic field of the inductors. Accordingly, a uniform magnetic field is achieved, thereby enabling to obtain a very large inductance.

Three or more stages of filters are constituted by connecting at least three of the LC resonators, and the pattern widths of the inductor patterns that constitute the LC resonators located at portions between both ends are wider than the pattern widths of the inductor patterns that constitute the LC resonators located at both ends. As a result, the magnetic field at the edges of the inductor patterns of the LC resonators located at portions between the ends thereof is minimized, thereby providing an LC filter having very loss.

Further, by laminating the patterns for a pole adjustment between the inductor patterns of the inductors, the pole position in the filter characteristic can be set freely, without blocking the magnetic field generated in the surroundings of the inductors. Accordingly, a LC filter with a high attenuation is obtained, thereby enabling to manufacture an excellent duplexer.

The invention may be embodied in other specific forms without departing from the spirit or essential characteristics thereof. The preferred embodiments are therefore to be considered in all respects as illustrative and not restrictive, the scope of the invention being indicated by the appended claims rather than by foregoing description and all changes which come within the meaning and range of equivalency of the claims are therefore intended to be embraced therein.

What is claimed is:

1. A laminated LC filter, comprising:

a laminated body including a stacked arrangement of a plurality of insulation layers, a plurality of inductor patterns, and a plurality of capacitor patterns; and a plurality of LC resonators including a plurality of inductors defined by said inductor patterns, and a plurality of capacitors defined by said capacitor patterns, said capacitor patterns being arranged opposite to said inductor patterns at an inner portion of said laminated body; wherein said inductor of each of the plurality of LC resonators has a multiplex structure including a laminated body having at least two of said inductor patterns and said insulation layers, and coupling capacitor patterns arranged between the inductor patterns of said inductors to capacitive-couple said LC resonators; and the pattern widths in a central portion of the laminated body are greater than the pattern widths at the end portions thereof.

2. A laminated LC filter according to claim 1, wherein at least three stages of filters are provided by connecting at least three of the LC resonators.

3. A laminated LC filter according to claim 1, wherein a pattern arranged to achieve pole adjustment laminated between the inductor patterns of said inductors.

4. A laminated LC filter, comprising:

a laminated body including a stacked arrangement of a plurality of stacked insulation layers, a plurality of inductor patterns, and a plurality of capacitor patterns;

a plurality of LC resonators including a plurality of inductors provided by said inductor patterns, and a plurality of capacitors, such that said capacitor patterns are opposite to said inductor patterns, at an inside of said laminated body; and capacitor patterns for input/output laminated between the inductor patterns of said inductors; wherein the pattern widths in a central portion of the laminated body are greater than the pattern widths at the end portions thereof.

5. A laminated LC filter according to claim 4, wherein at least three stages of filters are provided by connecting at least three of the LC resonators.

6. A laminated LC filter according to claim 4, wherein patterns arranged to achieve a pole adjustment are laminated between the inductor patterns of said inductors.

* * * * *